United States Patent
Chiou et al.

(10) Patent No.: US 6,187,669 B1
(45) Date of Patent: Feb. 13, 2001

(54) METHOD OF FORMING A NODE CONTACT OF A DRAM'S MEMORY CELL

(75) Inventors: Jung-Chao Chiou; Benjamin Szu-Min Lin, both of Hsin-Chu (TW)

(73) Assignee: United Microelectronics Corp., Hsin-Chu (TW)

( * ) Notice: Under 35 U.S.C. 154(b), the term of this patent shall be extended for 0 days.

(21) Appl. No.: 09/391,326

(22) Filed: Sep. 8, 1999

(51) Int. Cl.$^7$ ................................................. H01L 21/4763
(52) U.S. Cl. ........................... 438/637; 438/639; 438/640
(58) Field of Search ................................... 438/618, 597, 438/622, 624, 625, 637, 638, 639, 640, 253

(56) References Cited

U.S. PATENT DOCUMENTS 5,198,384 * 3/1993 Dennison .
6,074,955 * 6/2000 Lin et al. .
6,107,132 * 8/2000 Wang et al. .

* cited by examiner

*Primary Examiner*—Charles Bowers
*Assistant Examiner*—Evan Pert
(74) *Attorney, Agent, or Firm*—Winston Hsu

(57) ABSTRACT

This invention provides a method of forming a node contact with self-alignment on a semiconductor wafer. The wafer comprises a substrate, a dielectric layer, and a first and a second bit lines. A first side wall of the first bit line is adjacent to a second side wall of the second bit line and comprises a first region and two second regions adjacent to the first region. The distance between the first region and the second side wall is greater than a predetermined value and the distance between the two second regions and the second side wall is less than the predetermined value. A second insulating layer is formed on the dielectric layer and two bit lines to form a groove over the gap between the first region and the second side wall. A first anisotropic etching is performed to extend the bottom of the groove down to the dielectric layer. The remaining second insulating layer around the groove forms a spacer, and the remaining second insulating layer in the gaps between the two second regions and the second side wall still completely covers the surface of the two gaps. A second anisotropic etching process is performed to remove the dielectric layer at the bottom of the groove in a vertical direction down to the substrate so as to form the node contact.

7 Claims, 9 Drawing Sheets

METHOD OF FORMING A NODE CONTACT OF A DRAM'S MEMORY CELL

BACKGROUND OF THE INVENTION

1. Field of the Invention

The present invention relates to a method of forming a node contact of a DRAM's (dynamic random access memory) memory cell on a semiconductor wafer, and more particularly, to a method of forming a node contact for forming an electrical terminal for connecting the bottom electrode of a capacitor in the memory cells.

2. Description of the Prior Art

A memory cell of a stacked DRAM comprises a transistor and a capacitor stacked on the transistor. The stacked DRAM employs the transistor as a switch of a bit line that reads data stored in the capacitor. A conductor inside a node contact forms an electrical terminal for electrically connecting the bottom electrode of a capacitor with the transistor. The node contact passes through the space between two bit lines in the pattern design of the semiconductor wafer. As the space of two bit lines becomes smaller, a short circuit between the conductor inside the node contact and the neighboring bit lines is more likely to occur, which may result in losing the data stored in the capacitor. The fabrication of a node contact for electrically connecting the bottom electrode of the capacitor and for isolating the conductor inside the node contact via to prevent it from contacting the neighboring bit lines is an important subject in the semiconductor process.

Please refer to FIG. 1 to FIG. 6, which are schematic diagrams of the prior art method of forming the node contact 48. FIG. 1 is a top view of a prior art semiconductor wafer 10. FIG. 2 is a sectional view along line 2—2 of the semiconductor wafer 10 shown in FIG. 1. FIG. 3 is a sectional view along line 3—3 of the semiconductor wafer 10 shown in FIG. 1. FIG. 4 is a top view of a prior art node contact 48. FIG. 5 is a sectional view along line 5—5 of the semiconductor wafer 10 shown in FIG. 4. FIG. 6 is a sectional view along line 6—6 of the semiconductor wafer 10 shown in FIG. 4. The method of forming a prior art node contact 48 takes place on a semiconductor wafer 10. As shown in FIG. 1 to FIG. 3, the semiconductor wafer 10 comprises a substrate 12, a dielectric layer 14, a first bit line 16 and a second bit line 18. Each of the first and the second bit lines 16 and 18 has a rectangular cross section and two vertical side walls. The first side wall of the first bit line 16 comprises a first region 15 and two second regions 17 adjacent to the first region 15. The distance d1 between the first region 15 and the second side wall 19 is greater than a predetermined value, and the distance d2 between the two second regions 17 and the second side wall 19 is less than the predetermined value.

The method of forming the node contact 48 according the prior art begins with forming a second dielectric layer (not shown) on the vertical side walls of the first bit line 16 and the second bit line 18. The second dielectric layer forms a spacer 30 surrounding the vertical side walls of the first bit line 16 and the second bit line 18. The distance d1 between the first region 15 and the second side wall 19 of the second bit line 18 is larger, and the distance d2 between the two second regions 17 of the first bit line 16 and the second side wall 19 of the second bit line 18 is smaller. Thus, a groove 32 with a larger opening is formed over the gap between the two spacers 30 of the first region 15 and the second side wall 19, and a gap 34 with a high aspect ratio is formed over the gap between the two spacers 30 of the second region 17 and the second side wall 19.

As shown in FIG. 4 to FIG. 6, a third dielectric layer 40 is formed on the semiconductor wafer 10 to fill the groove 32. A lithography process is then employed to form a photo-resistance layer (not shown) with a hole to define the position of the node contact. Then, an anisotropic etching process without removing the spacer 30 is performed to remove the third dielectric layer 40 and the first dielectric layer 14 under the hole of the photo-resistance layer in a vertical direction and form a node contact 48. And then the photo-resistance layer is removed to complete the formation of the node contact 48. During the formation of the third dielectric layer 40, the third dielectric layer 40 can't completely fill the gap 34 because of its high aspect ratio. As a result, a pipe (void) 42 is formed between the two spacers 30 of the second region 17 and the second side wall 17.

Please refer to FIG. 7 to FIG. 9, which are schematic diagrams of the formation the polysilicon layer 50 inside the node contact 48 according to the prior art. FIG. 7 is a top view of the polysilicon layer 50 formed inside the node contact 48 shown in FIG. 9. FIG. 8 is a sectional view along line 8—8 of the semiconductor wafer 10 shown in FIG. 7. FIG. 9 is a sectional view along line 9—9 of the semiconductor wafer 10 shown in FIG. 7. After the formation of the node contact 48, a polysilicon layer 50 which fills the node contact 48 is formed to be used as an electrical terminal for connecting the transistor of the semiconductor wafer 10 and the bottom electrode of the subsequent fabricated capacitor. However, due to the connection between the node contact 48 and the pipe 42 under the third dielectric layer 40, it is easy to fill the pipe 42 with the polysilicon layer 50 during the formation of the polysilicon layer 50 inside the node contact 48. The polysilicon layer 50 inside the pipe 42 results in forming a leakage path between each of the capacitors in the subsequent electrical connection processes. In FIG. 7, the arrow 52 shows the direction of the leakage path.

In the prior art method of forming the node contact 48, the pipe 42 is formed, leading to the formation of the polysilicon layer 50 inside the pipe 42 when forming the polysilicon layer 50 inside the node contact 48. Although the node contact 48 is surrounded by the dielectric layer 14 to isolate the polysilicon layer 50 from contacting the first bit line 16 and the second line 18, the polysilicon layer 50 inside the pipe 42 forms the leakage path between each capacitor resulting in losing the data by changing the number of the charges stored in the capacitor.

SUMMARY OF THE INVENTION

It is therefore a primary objective of the present invention to provide a method of forming a node contact with self-alignment to prevent the formation of the leakage path between each capacitor.

In a preferred embodiment, the present invention provides a method of forming a node contact of a DRAM's memory cell on a semiconductor wafer, the semiconductor wafer comprising a substrate, a dielectric layer positioned on the substrate, and a first bit line and a second bit line positioned on the dielectric layer, each of the two bit lines having two vertical side walls and a rectangular cross section, and comprising a conductive layer on the dielectric layer with an overlying first insulating layer wherein a first side wall of the first bit line is adjacent to a second side wall of the second bit line and the first side wall comprises a first region and two second regions adjacent to the first region, the distance between the first region and the second side wall being greater than a predetermined value and the distance between the two second regions and the second side wall being less than the predetermined value; the method comprising:

forming a second insulating layer on the dielectric layer and the two bit lines which fills the gap between each of the two second regions and the second side wall and partially fills the gap between the first region and the second side wall which forms a groove over the gap between the first region and the second side wall;

performing a first anisotropic etching process to completely remove the second insulating layer above the two bit lines and to extend the bottom of the groove between the first region and the second side wall down to the dielectric layer, the remaining second insulating layer around the groove forming a spacer for covering and isolating the conductive layer in each of the two bit lines around the groove, the remaining second insulating layer in the gaps between the two second regions and the second side wall still completely covering the surface of the two gaps; and performing a second anisotropic etching process to remove the dielectric layer at the bottom of the groove in a vertical direction down to the substrate so as to form the node contact.

It is an advantage of the present invention that the method can form a node contact with self-alignment and no precise photo-resistance layer is required so that the whole process becomes easier and smoother, and the yield of the semiconductor product can be enhanced. Also, no leakage path between each of the capacitors will occur.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 1:
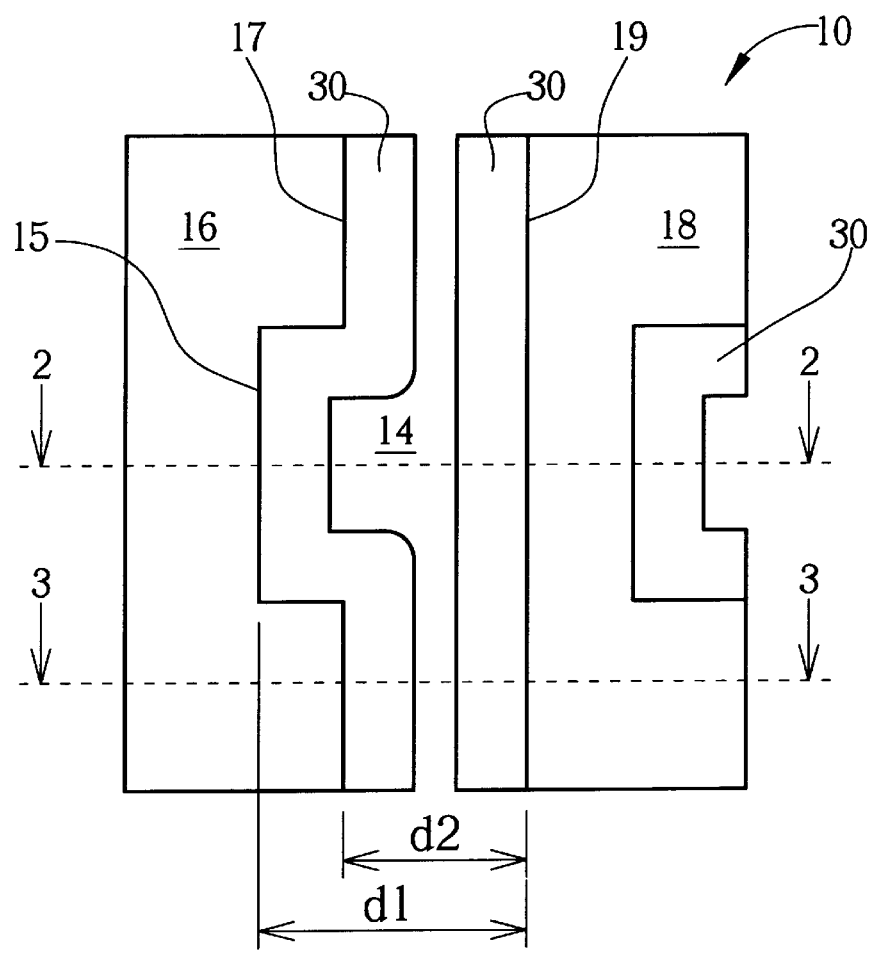
FIG. 1 to FIG. 6 are schematic diagrams of the prior art method of forming the node contact.
Figure 2:
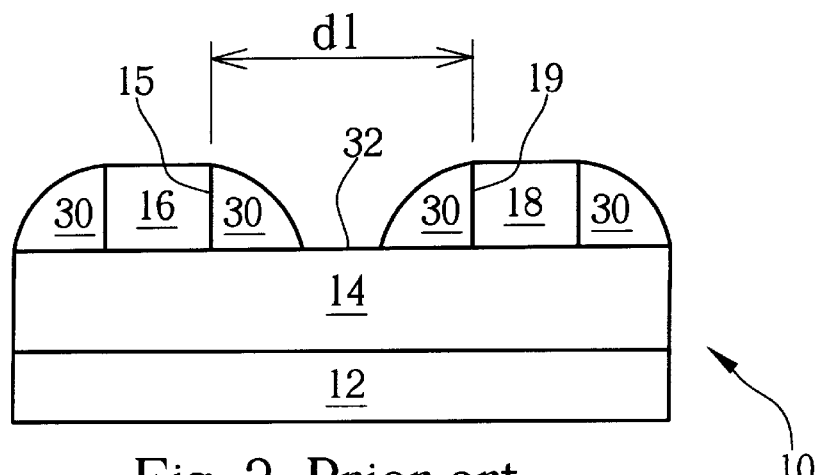
Figure 3:
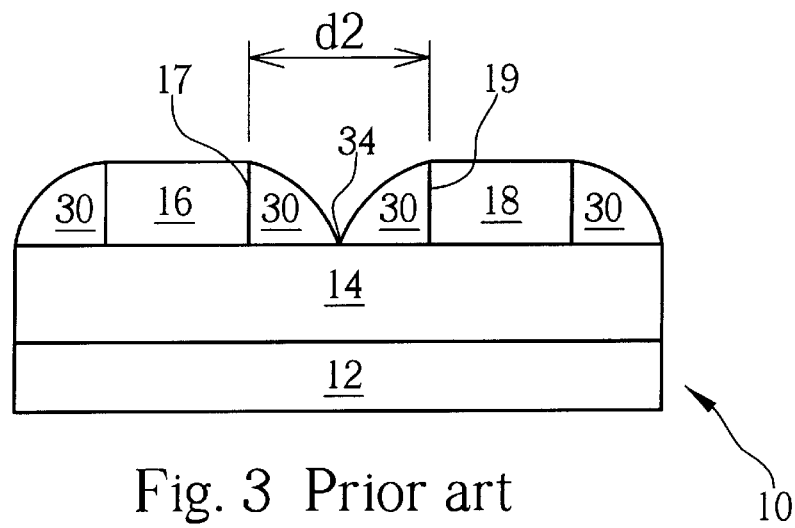
Figure 4:
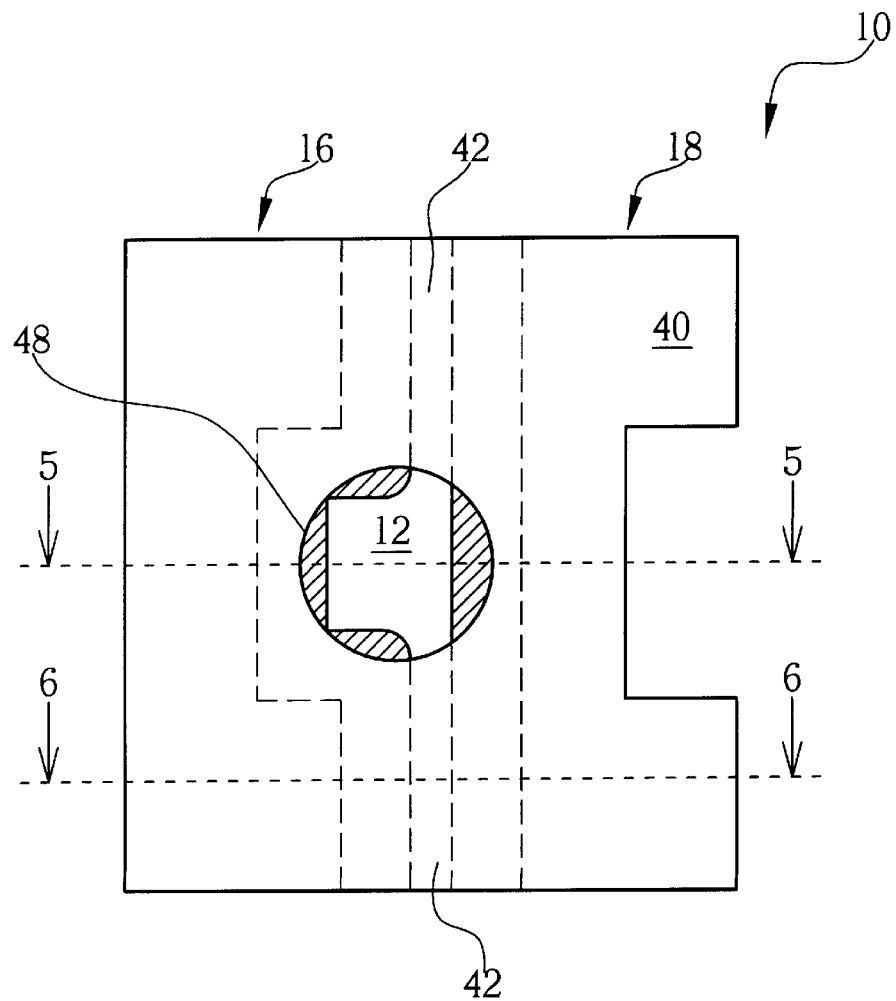
Figure 5:
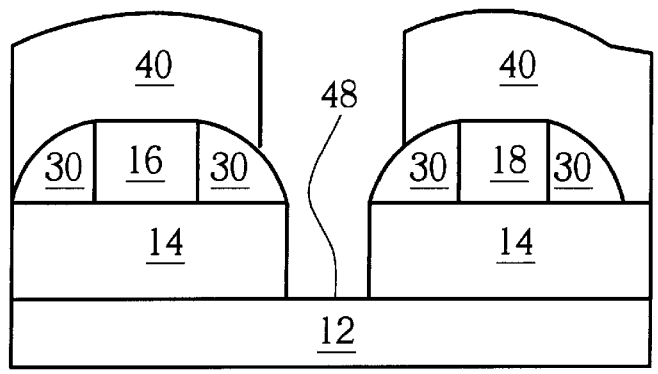
Figure 6:
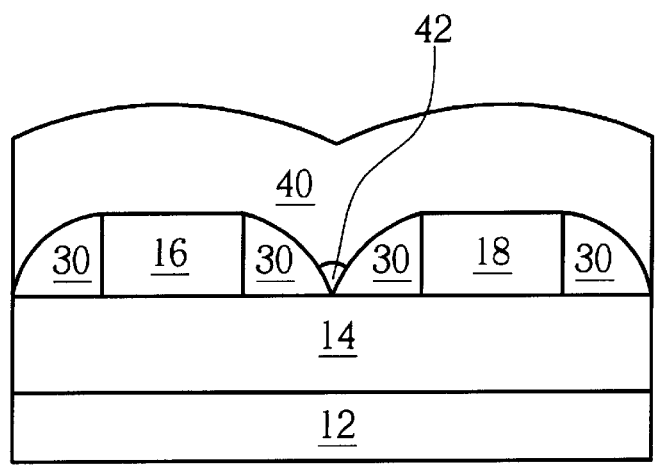
Figure 8:
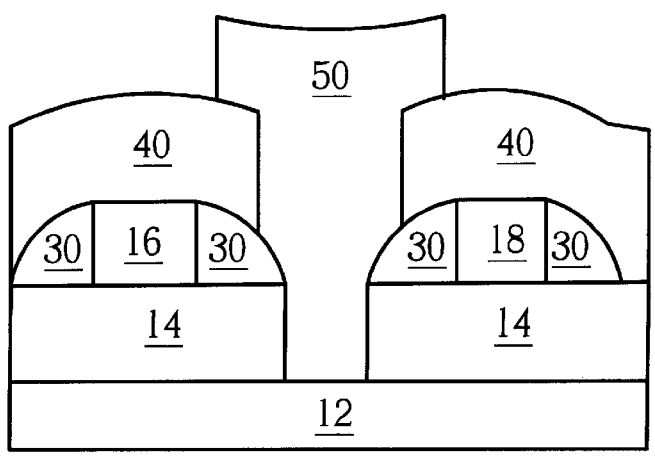
FIG. 7 to FIG. 9 are schematic diagrams of the formation the polysilicon layer inside the prior art node contact.
Figure 7:
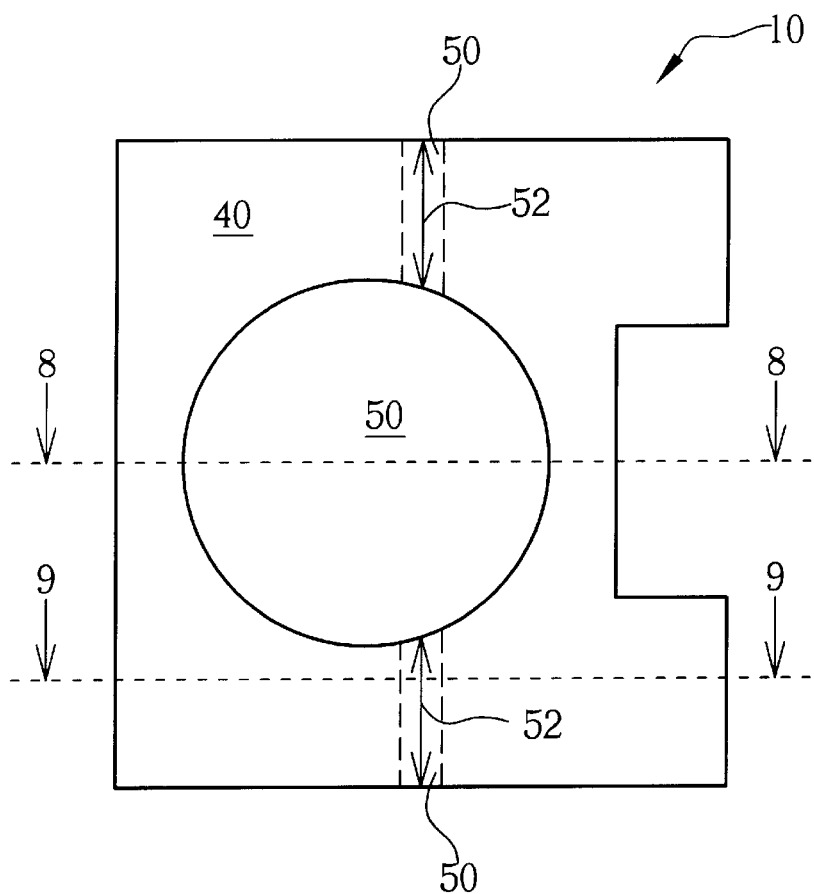
Figure 9:
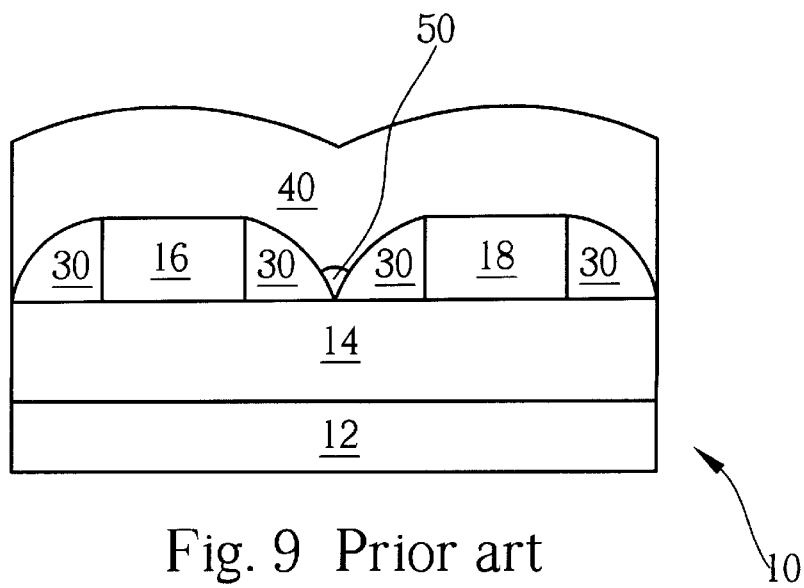
Figure 10:
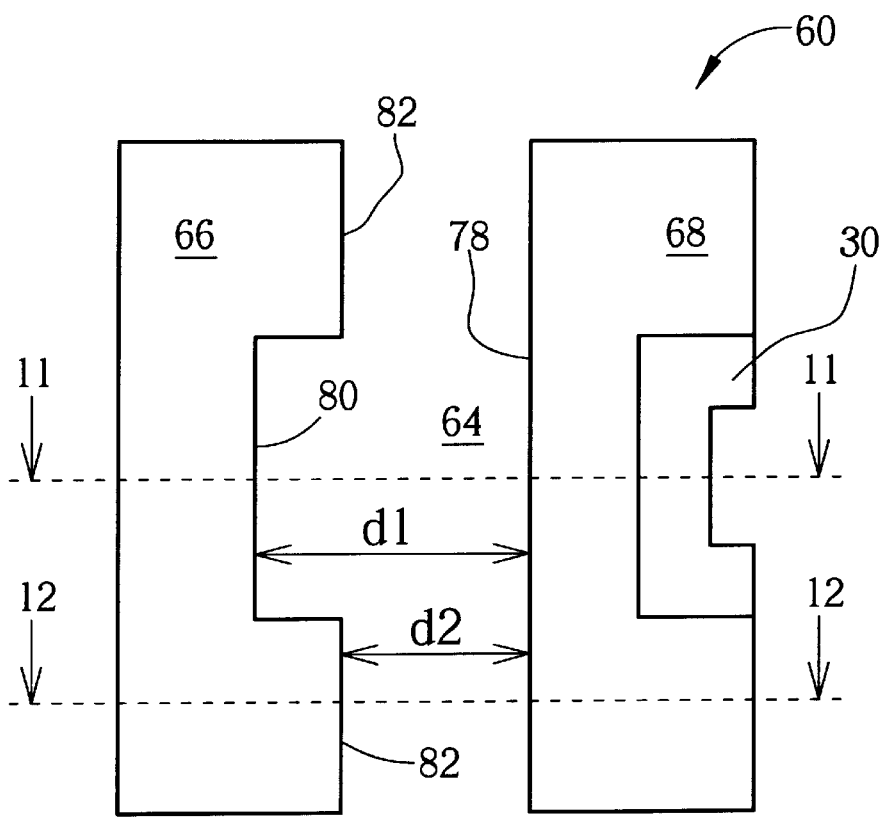
FIG. 10 is a top view of a semiconductor wafer for forming a node contact according to the present invention.
Figure 11:
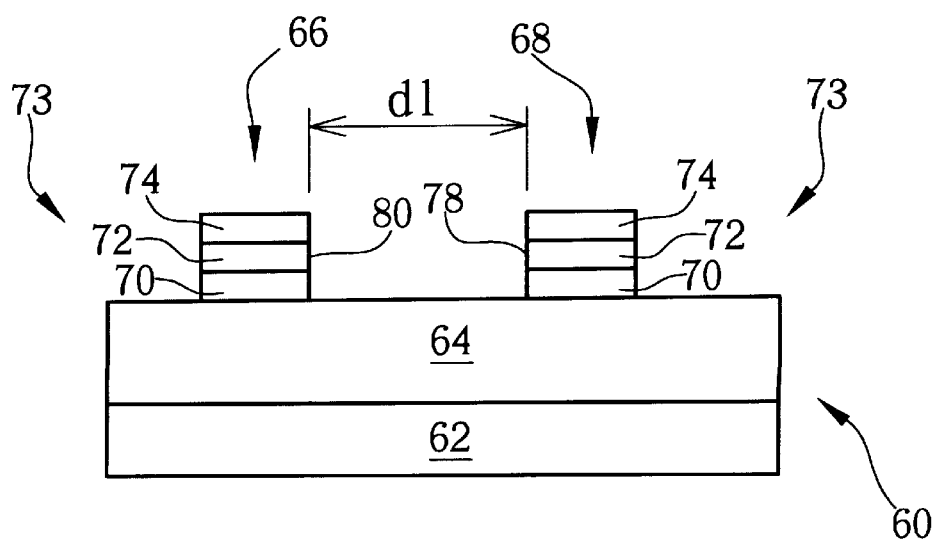
FIG. 11 is a sectional view along line 11—11 of the semiconductor wafer shown in FIG. 10.
Figure 12:
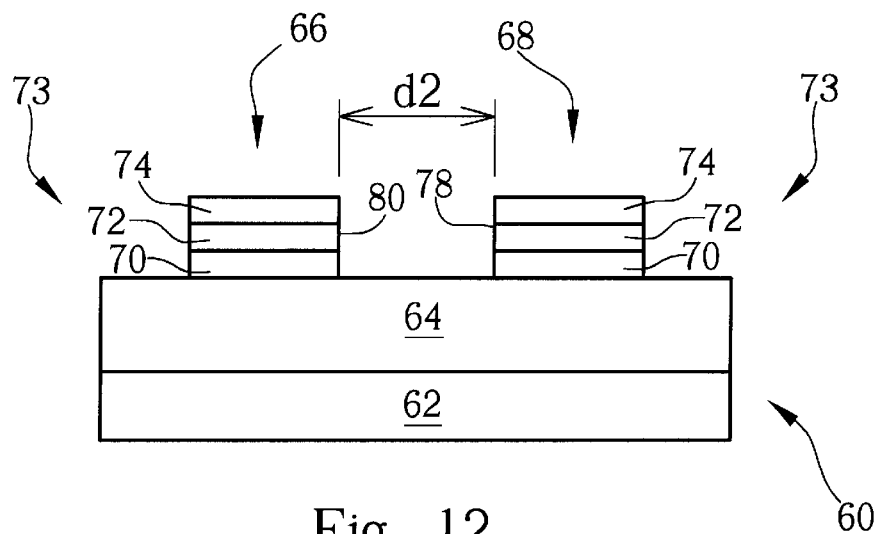
FIG. 12 is a sectional view along line 12—12 of the semiconductor wafer shown in FIG. 10.

Please refer to FIG. 10 to FIG. 12. FIG. 10 is a top view of a semiconductor wafer 60 for forming a node contact according to the present invention. FIG. 11 is a sectional view along line 11—11 of the semiconductor wafer 60 shown in FIG. 10. FIG. 12 is a sectional view along line 12—12 of the semiconductor wafer 60 shown in FIG. 10. The method of forming a node contact 90 with self-alignment according to the present invention takes place on a semiconductor wafer 60. The semiconductor wafer 60 comprises a substrate 62, a dielectric layer 64 positioned on the substrate 62, a first bit line 66 and a second bit line 68 positioned on the dielectric layer 64. The dielectric layer 64 is formed of silicon oxide. Each of the two bit lines 66 and 68 comprise a conductive layer 73 on the dielectric layer 64 with an overlying first insulating layer 74 that is formed of silicon nitride. The conductive layer 73 comprises a polysilicon layer 70 positioned on the dielectric layer 64 and a tungsten silicide layer 72 positioned on the polysilicon layer 70.

Each of the first bit line 66 and the second bit line 68 has a rectangular cross section and two vertical side walls. A first side wall of the first bit line 66 is adjacent to a second side wall 78 of the second bit line 68, and comprises a first region 80 and two second regions 82 adjacent to the first region 80. The distance d1 between the first region 80 in the first side wall of the first bit line 66 and the second side wall 78 of the second bit line 68 is larger than a predetermined value. The distance d2 between the second region 82 in the first side wall of the first bit line 66 and the second side wall 78 of the second bit line 68 is larger than a predetermined value.

Figure 13:
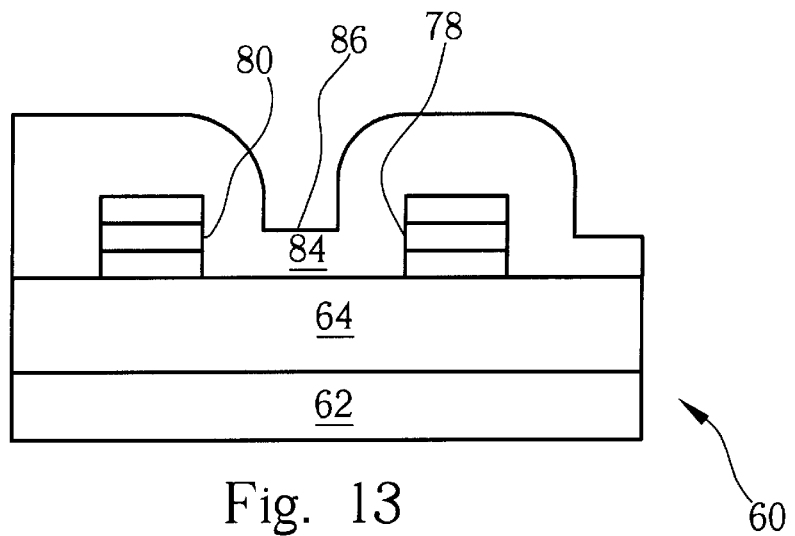
FIG. 13 to FIG. 16 are schematic diagrams of the method of forming the node contact according to the present invention.
Figure 14:
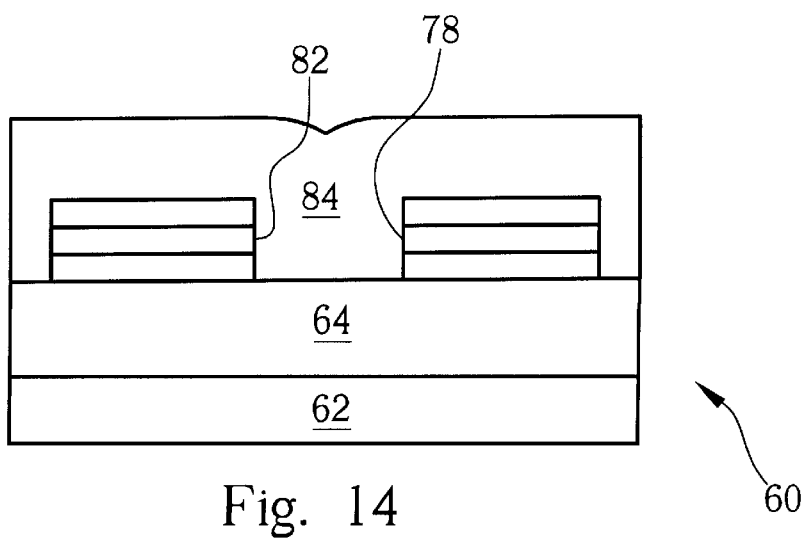

Please refer to FIG. 13 to FIG. 16. FIG. 13 to FIG. 16 are schematic diagrams of the method of forming the node contact according to the present invention. In the formation of the node contact according to the present invention, a second insulating layer 84 made of silicon nitride is formed on the first bit line 66, the second bit line 68, and the dielectric layer 64. The distance d1 between the first region 80 and the second side wall 78 is larger than the distance d2 between the second region 82 and the second side wall 78. Thus, the second insulating layer 84 can completely fill the gap between the two second regions 82 and the second side wall 78, as shown in FIG. 14. And a groove 84 is formed over the gap between the first region 80 and the second side wall 78, as shown in FIG. 13.

Figure 15:
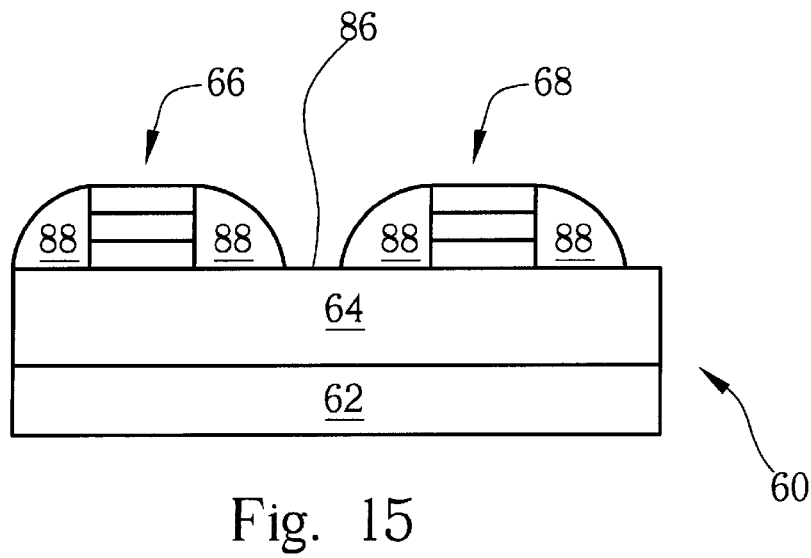
Figure 16:
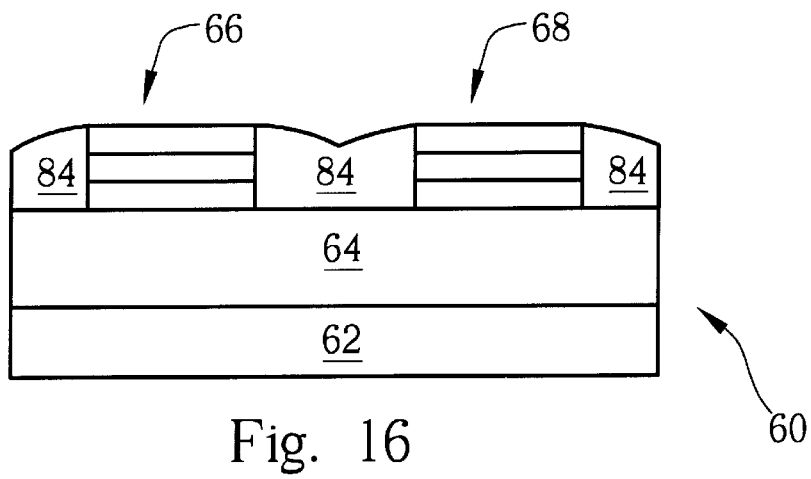

A first anisotropic etching process is performed to completely remove the second insulating layer 84 above the first bit line 66 and the second bit line 68, and to extend the bottom of the groove 86 down to the dielectric layer 64. The remaining second insulating layer 84 around the groove 86 forms a spacer 88 for covering and isolating the conductive layer 73 in each of the first bit line 66 and the second bit line 68 around the groove 86, as shown in FIG. 15. The remaining second insulating layer 84 in the gaps between the two second regions 82 and the second side wall 78 still completely covers the surface of the gaps, as shown in FIG. 16.

An array area (not shown) is defined on the semiconductor wafer 60 to form a plurality of the memory cells of a DRAM. The first bit line 66, the second bit line 68 and the gap between two bit lines 66,68 are located in the array area. Then, a lithography process is performed to form a photo-resistance layer (not shown) in a predetermined area outside the array area of the semiconductor wafer. The photo-resistance layer can protect the predetermined area of the semiconductor wafer 60 from being damaged by the subsequent etching process.

Figure 18:
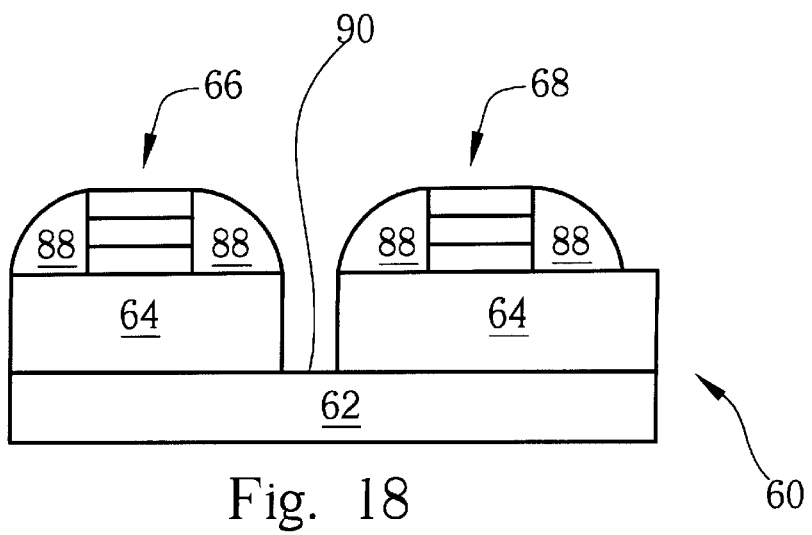
FIG. 18 is a sectional view along line 18—18 of the semiconductor wafer shown in FIG. 17.
Figure 17:
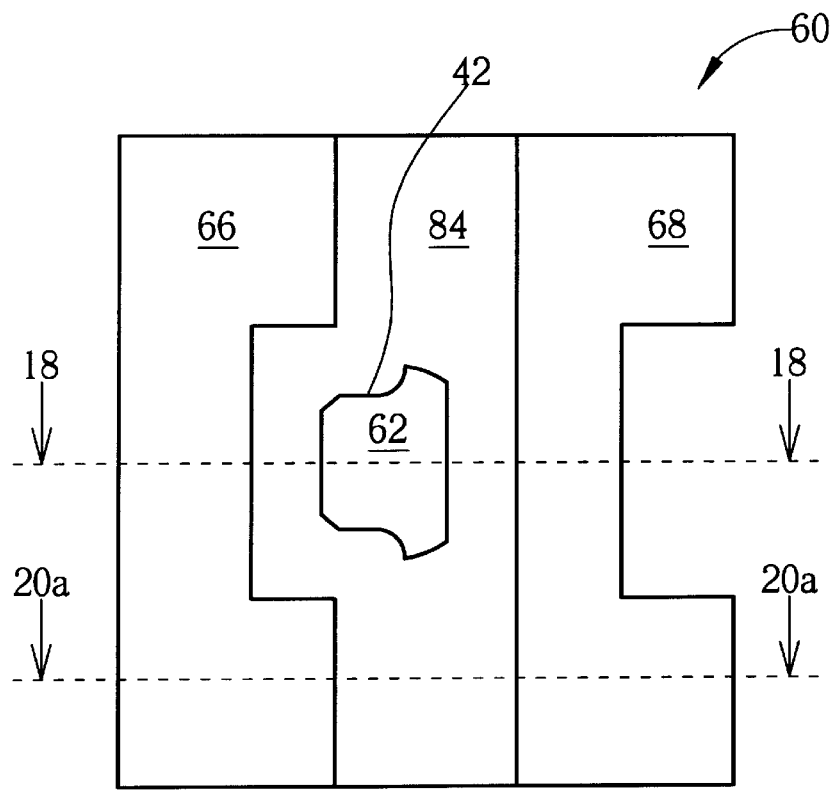
FIG. 17 is a schematic diagram of the node contact on the semiconductor wafer according to the present invention.

Please refer to FIG. 17 and FIG. 18. FIG. 17 is a schematic diagram of the node contact 90 on the semiconductor wafer 60 according to the present invention. FIG. 18 is a sectional view along line 18—18 of the semiconductor wafer 60 shown in FIG. 17. Then, a second anisotropic etching process using the first insulating layer 74 and the remaining second insulating layer 84 as a hard mask is performed to remove the dielectric layer 64 at the bottom of the groove 86 in a vertical direction down to the substrate 62 so as to form the node contact 90. After removing the photo-resistance layer, the formation of the node contact 90 with self-alignment according to the present invention is completed. During the formation of the node contact 90 by the anisotropic etching process, the node contact 90 can self-align the center over the gap between the first region 80 in the first side wall of the first bit line 66 and the second side wall 78 of the second bit line 68.Thus, the node contact 90 is formed at the bottom of the groove 86. As a result, the node contact 90 keeps away from the neighboring bit lines. The gap between the second region 82 of the first side wall and the second side wall 78 of the second bit line 68 is not influenced by etching because the second dielectric layer 84 plays as a hard mask. Therefore, the sectional view along line 20a—20a of the semiconductor wafer 60 shown in FIG. 17 is still the same as the view shown in FIG. 16.

Figure 19:
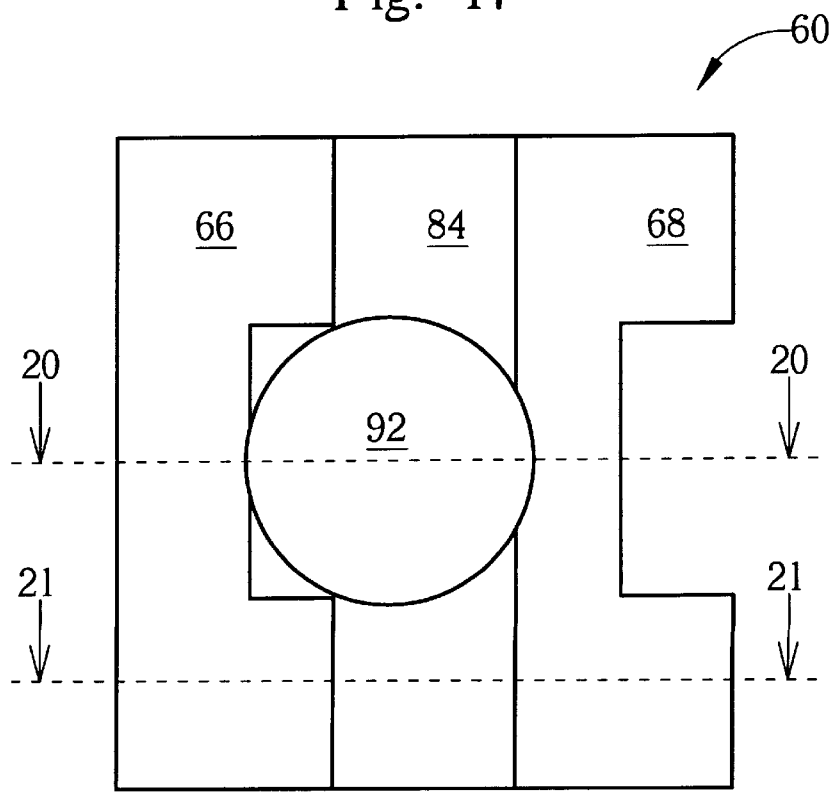
FIG. 19 is a top view of the polysilicon layer formed inside the node contact shown in FIG. 17.
Figure 20:
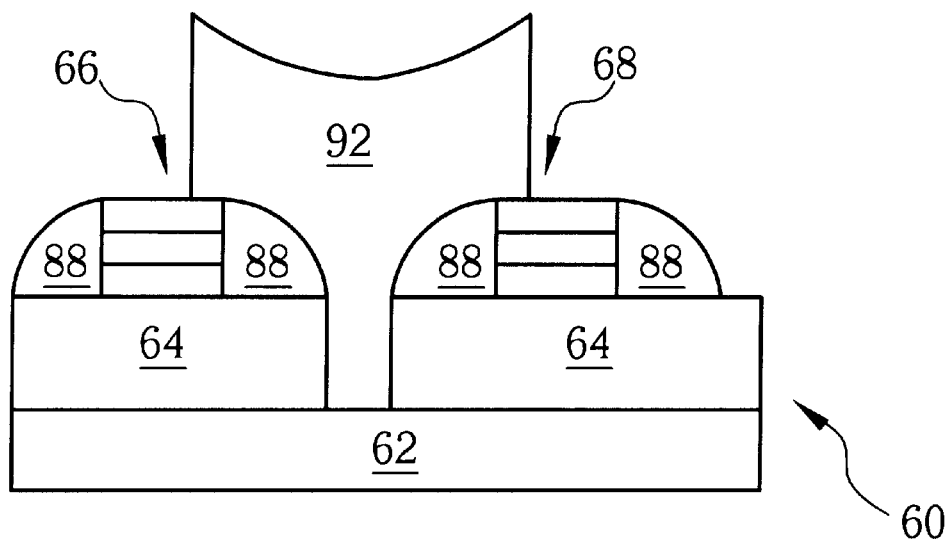
FIG. 20 is a sectional view along line 20—20 of the semiconductor wafer shown in FIG. 19.
Figure 21:
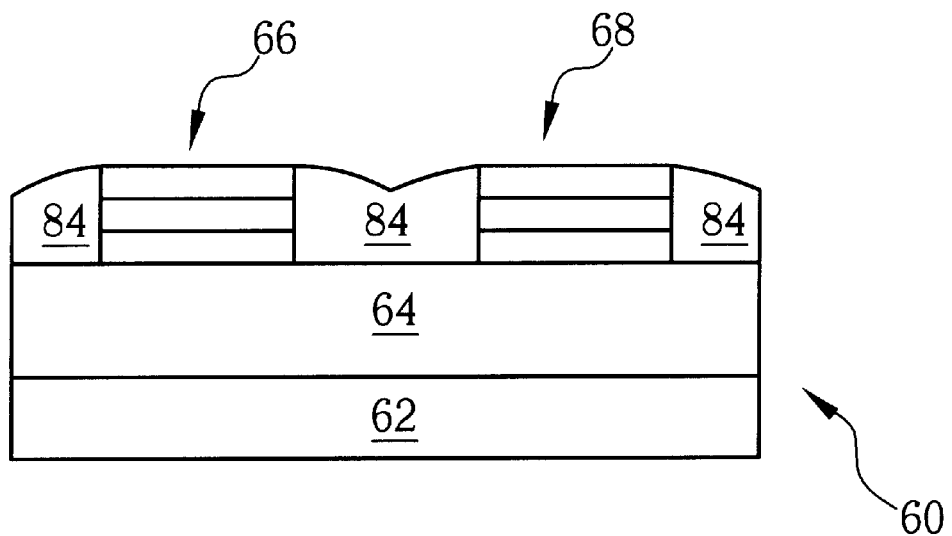
FIG. 21 is a sectional view along line 21—21 of the semiconductor wafer shown in FIG. 19.

Please refer to FIG. 19 to FIG. 21. FIG. 19 is a top view of the polysilicon layer 92 formed inside the node contact 90 shown in FIG. 17. FIG. 20 is a sectional view along line 20—20 of the semiconductor wafer 60 shown in FIG. 19. FIG. 21 is a sectional view along line 21—21 of the semiconductor wafer 60 shown in FIG. 19. After the formation of the node contact 90, a polysilicon layer 92 inside the node contact 90 can proceed to form an electrical terminal for connecting the transistor of the semiconductor wafer 60 and the bottom electrode of the subsequent formed capacitor.

In the method of forming the node contact according to the present invention, the node contact is formed with self-alignment and hence a precise photo-resistance layer is not required. That is the mis-alignment tolerance of the photo-resistance layer is larger. Thus, the whole process becomes easier and smoother, and the yield of the semiconductor product can be increased. In addition, the second insulating layer 84 can completely fill the gap between the two second regions 82 and the second side wall 78 to prevent the formation of the polysilicon layer 92 inside the gap. As a result, the polysilicon layer 50 inside the node contact 90 can be isolated from the first bit line 66 and the second bit line 68. No leakage path between each of the capacitors will occur. Therefore, the number of the charges in the capacitor is stable and the memory data can be hold.

In contrast to the prior art method of forming the node contact 48, the method of forming the node contact 90 with self-alignment according to the present invention forms the second insulating layer 84 on the first bit line 66 and the second bit line 68. The second insulating layer 84 can completely fill the gap between the first bit line 66 and the second bit line 68. The first insulating layer 74 and the second insulating layer 84 are used as a hard mask to form the node contact 90. Therefore, the node contact 90 can self-align the center of the gap between the first region 80 in the first side wall of the first bit line 66 and the second side wall 78 of the second bit line 68. The polysilicon layer 50 formed inside the node contact 90 according to the present invention can form the electrical terminal for connecting the bottom electrode of the capacitor in each of the memory cells and be isolated from the first bit line 66 and the second bit line 68. No leakage path occurs between each of the capacitors and the number of the charges stored in the capacitor is stable and the memory data can be hold.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of forming a node contact on a semiconductor wafer, the semiconductor wafer comprising a substrate, a dielectric layer positioned on the substrate, and a first bit line and a second bit line positioned on the dielectric layer, each of the two bit lines having two vertical side walls and a rectangular cross section, and comprising a conductive layer on the dielectric layer with an overlying first insulating layer wherein a first side wall of the first bit line is adjacent to a second side wall of the second bit line and the first side wall comprises a first region and two second regions adjacent to the first region, the distance between the first region and the second side wall being greater than a predetermined value and the distance between the two second regions and the second side wall being less than the predetermined value; the method comprising:

forming a second insulating layer on the dielectric layer and the two bit lines which fills the gap between each of the two second regions and the second side wall and partially fills the gap between the first region and the second side wall which forms a groove over the gap between the first region and the second side wall;

performing a first anisotropic etching process to completely remove the second insulating layer above the two bit lines and to extend the bottom of the groove between the first region and the second side wall down to the dielectric layer, the remaining second insulating layer around the groove forming a spacer for covering and isolating the conductive layer in each of the two bit lines around the groove, the remaining second insulating layer in the gaps between the two second regions and the second side wall still completely covering the surface of the two gaps; and performing a second anisotropic etching process to remove the dielectric layer at the bottom of the groove in a vertical direction down to the substrate so as to form the node contact.

2. The method of claim 1 wherein the semiconductor wafer comprises an array area in which a plurality of memory cells of a dynamic random access memory (DRAM) are formed and in which the two bit lines are located.

3. The method of claim 2 further comprising a lithography process performed before the second anisotropic etching process which forms a photo-resistance layer in a predetermined area outside the array area of the semiconductor wafer for protecting the predetermined area of the semiconductor wafer from being damaged by the second anisotropic etching process.

4. The method of claim 2 wherein the node contact is employed to form an electrical terminal for connecting the bottom electrode of the capacitor in each of the memory cells.

5. The method of claim 1 wherein the dielectric layer is formed of silicon oxide.

6. The method of claim 1 wherein the conductive layer of each of the two bit lines comprises a poly-silicon layer positioned on the dielectric layer and a tungsten silicide layer positioned on the poly-silicon layer.

7. The method of claim 1 wherein the first insulating layer and the second insulating layer are both formed of silicon nitride.

* * * * *